United States Patent
Boni et al.

(10) Patent No.: US 11,448,871 B2
(45) Date of Patent: Sep. 20, 2022

(54) MICROMECHANICAL DEVICE HAVING A STRUCTURE TILTABLE BY A QUASI-STATIC PIEZOELECTRIC ACTUATION AND HAVING STIFFENING ELEMENTS

(71) Applicant: STMicroelectronics S.r.l., Agrate Brianza (IT)

(72) Inventors: Nicolo' Boni, Alzano Lombardo (IT); Roberto Carminati, Piancogno (IT); Massimiliano Merli, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 568 days.

(21) Appl. No.: 16/539,109

(22) Filed: Aug. 13, 2019

(65) Prior Publication Data
US 2020/0057298 A1 Feb. 20, 2020

(30) Foreign Application Priority Data
Aug. 14, 2018 (IT) .................. 102018000008091

(51) Int. Cl.
*G02B 26/08* (2006.01)
*H02N 2/02* (2006.01)
*H02N 2/04* (2006.01)

(52) U.S. Cl.
CPC ......... *G02B 26/0858* (2013.01); *H02N 2/028* (2013.01); *H02N 2/043* (2013.01)

(58) Field of Classification Search
CPC .. G02B 26/0858; G02B 26/101; H02N 2/028; H02N 2/043; B81B 2201/042; B81B 3/0051
See application file for complete search history.

(56) References Cited

U.S. PATENT DOCUMENTS

| 10,175,474 B2 | 1/2019 | Giusti et al. |
| 2014/0117888 A1 | 5/2014 | Iyad Al Dibs et al. |
| 2014/0320943 A1 | 10/2014 | Oyama et al. |
| 2020/0049978 A1* | 2/2020 | Ogata .................. B81B 3/0043 |

FOREIGN PATENT DOCUMENTS

| EP | 3178783 A1 | 6/2017 |
| JP | 2005156684 A | 6/2005 |

OTHER PUBLICATIONS

IT Search Report and Written Opinion for IT Appl. No. 102018000008091 dated Mar. 27, 2019 (8 pages).
Tani Masanao et al: "A Two-Axis Piezoelectric Tilitng Micromirror with a Newly Developed PZT -Meandering Actuator," MEMS 2007, Kobe, Japan, Jan. 21-25, 2007, pp. 699-702, XP031203748.

* cited by examiner

*Primary Examiner* — Emily P Pham
(74) *Attorney, Agent, or Firm* — Crowe & Dunlevy

(57) ABSTRACT

A micromechanical device includes a fixed structure, a mobile portion rotatable about a first rotation axis, and a first actuation structure arranged between the fixed structure and the mobile portion to enable rotation of the mobile portion about the first rotation axis. The mobile portion includes a supporting structure, a tiltable platform rotatable about a second rotation axis, transverse to the first rotation axis, and a second actuation structure coupled between the tiltable platform and the supporting structure. Stiffening elements are arranged between the supporting structure and the fixed structure. The micromechanical device may be used within a pico-projector.

27 Claims, 9 Drawing Sheets

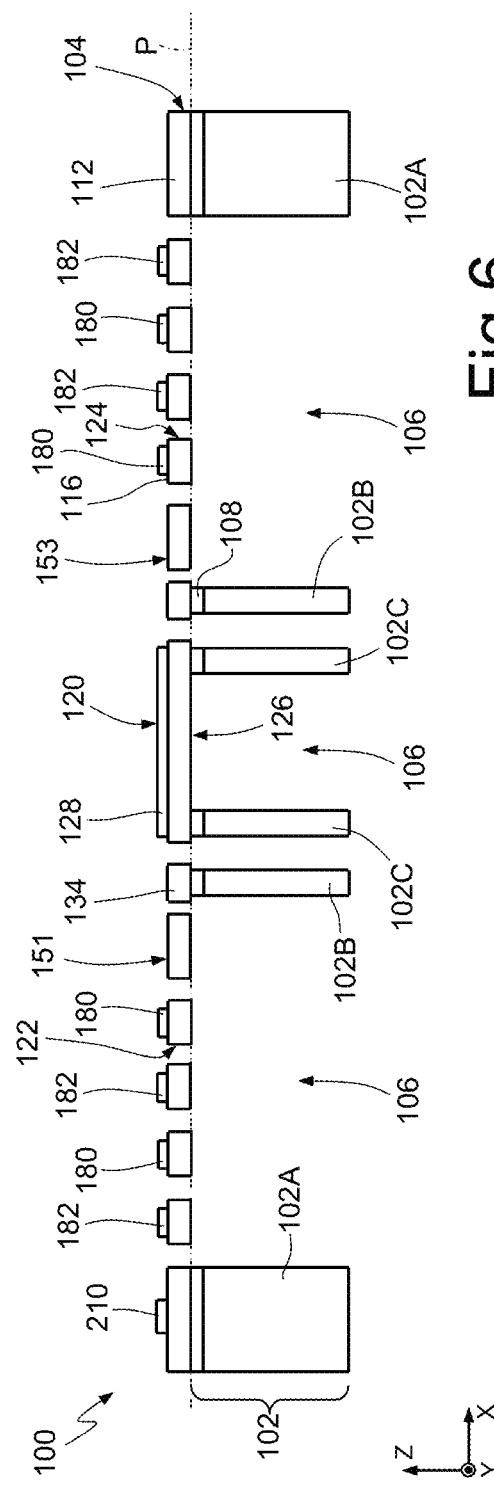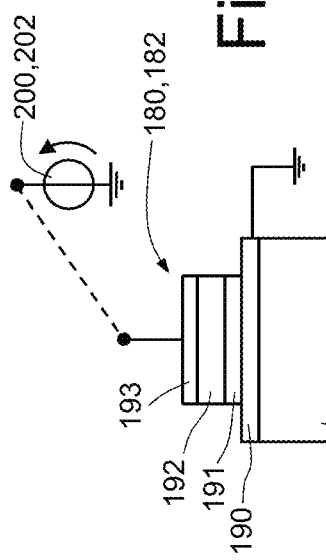

MICROMECHANICAL DEVICE HAVING A STRUCTURE TILTABLE BY A QUASI-STATIC PIEZOELECTRIC ACTUATION AND HAVING STIFFENING ELEMENTS

PRIORITY CLAIM

This application claims the priority benefit of Italian Application for Patent No. 102018000008091, filed on Aug. 14, 2018, the content of which is hereby incorporated by reference in its entirety to the maximum extent allowable by law.

TECHNICAL FIELD

This disclosure relates to a micromechanical device having a structure tiltable by quasi-static piezoelectric actuation and with stiffening elements. In particular, hereinafter reference will be made to a micromirror built using MEMS (Micro-Electro-Mechanical Systems) technology, without this implying any loss of generality.

BACKGROUND

Micromechanical devices are known to have a mirror structure obtained with the technology of semiconductor materials. Such micromechanical devices are used in portable apparatuses, such as portable computers, laptops, notebooks (including ultra-thin notebooks), PDAs, tablets, mobile phones, and smartphones, for optical applications, in particular for directing beams of light radiation generated by a light source with desired modalities.

Thanks to the small dimensions of these devices, these devices can meet stringent requirements regarding the occupation of space, in terms of area and thickness. For instance, micromechanical mirror devices are used in miniaturized projector modules (the so-called "pico-projectors"), which are able to project images at a distance or to generate desired patterns of light. In combination with an image-capture module, a projector module of this type allows, for example, to provide a three-dimensional (3D) photographic or video camera for the formation of three-dimensional images.

Micromechanical mirror devices generally include a mirror element suspended over a cavity and obtained starting from a body made of semiconductor material in order to be mobile, for example with movement of inclination or rotation, so as to direct the incident light beam in a desired way.

FIG. 1 is a schematic illustration of a pico-projector 9 comprising a light source 1, typically a laser source, generating a light beam 2 comprised of three monochromatic beams, one for each base color, and which, through an optics system 3 illustrated only schematically, is deflected by a mirror element 5 towards a screen 6. In the illustrated example, the mirror element 5 is of a two-dimensional type, controlled so as to rotate about a first rotation axis A (here, vertical) and a second rotation axis B (here, horizontal). Rotation of the mirror element 5 about the first rotation axis A generates a fast horizontal scan, as illustrated in FIG. 2. Rotation of the mirror element 5 about the second rotation axis B, perpendicular to the first rotation axis A, generates a slow vertical scan, typically a saw-tooth one. The obtained scanning scheme is illustrated in FIG. 2 and designated by reference numeral 7.

Rotation of the mirror element 5 is controlled via an actuation system that is currently of an electrostatic, magnetic, or piezoelectric type.

An example of device wherein the movement of scanning about at least the second rotation axis B is controlled in a piezoelectric way is described with reference to U.S. Pat. No. 10,175,474 (incorporated by reference) and schematically illustrated in FIGS. 3 and 4.

In particular, FIGS. 3 and 4 show a micromechanical device 20 having a tiltable structure 22 that is able to rotate about the second rotation axis B, here parallel to a first axis X of the reference system XYZ. The tiltable structure 22 is suspended over a cavity (not illustrated), here has a quadrangular shape, in particular rectangular, and is supported by a supporting and actuating structure 24. The supporting and actuating structure 24 comprises a first spring element 25 and a second spring element 26, which are laterally arranged with respect to the tiltable structure 22, in particular on opposite sides thereof, intersected by the second rotation axis B.

As clearly shown in FIG. 3, the spring elements 25, 26 have a spiral shape and each have a first end 30, 31, respectively, and a second end 34, 35, respectively. The first ends 30, 31 of the spring elements 25, 26 are internal to the spiral shape and are anchored to the bottom of the cavity (not illustrated) through anchorage elements 32, 33 (represented as dashed in FIG. 3), perpendicular to the tiltable structure 22. The second ends 34, 35 of the spring elements 25, 26 are external to the spiral shape and are fixed to the tiltable structure 22. Here, the first ends 30, 31 and the second ends 34, 35 of the spring elements 25, 26 are not aligned to each other with respect to the second rotation axis B and are set on the same side thereof.

The spring elements 25, 26 are formed by a plurality of first arms 40, 41, respectively, and by a plurality of second arms 42, 43, respectively, parallel to each other and perpendicular with respect to the second rotation axis B. For each of the spring elements 25 and 26, the first arms 40 and 41 are located between the tiltable structure 22 and a respective median plane C, D of the spring elements 25, 26, the median plane C, D being perpendicular to the second rotation axis B. The second arms 42, 43 extend from the opposite side with respect to the respective median plane C, D of the spring elements 25, 26.

Following the spiral shape of the spring elements 25, 26 starting from their first ends 30, 31, the innermost arm of each spiral shape is formed by a second arm 42, 43 (here designated as 42A, 43A) anchored to the respective anchorage element 32, 33.

Still following the spiral shape of the spring elements 25, 26 starting from their first ends 30, 31, each first arm 40, 41 is connected to a previous second arm 42, 43 (or to the second arm 42A, 43A) via a respective first spring portion 36, 37, which extends perpendicular to the first and second arms 40-43, on the side of the second rotation axis B opposite to the respective anchorage element 32 and 33.

Still following the spiral shape of the spring elements 25, 26 starting from their first ends 30, 31, each second arm 42, 43 is connected to a previous first arm 40, 41 via a respective second spring portion 38, 39, which extends perpendicular to the first and second arms 40-43, on the same side of the second rotation axis B with respect to the respective anchorage element 32 and 33. Still following the spiral shape of the spring elements 25, 26 starting from their first ends 30, 31, the tiltable structure 22 is connected to the spring elements 25, 26 through a first arm 40A, 41A.

With reference to FIG. 4, each of the first arms 40, 41 carries a respective first piezoelectric band 44 of piezoelectric material; likewise, each of the second arms 42, 43 carries a respective second piezoelectric band 45 of piezoelectric material. For instance, the piezoelectric bands 44, 45 may be a PZT (lead-titanate-zirconate)-based ceramic.

The first piezoelectric bands 44 may be electrically connected, in use, to a first voltage source 46, and the second piezoelectric bands 45 may be electrically connected, in use, to a second voltage source 47 via metal connections illustrated only schematically.

Once again with reference to FIG. 3, the tiltable structure 22 is formed by a tiltable platform 50 suspended from a frame 51 through two torsion springs 52 so as to be able to rotate about the first rotation axis A, here parallel to a second axis Y of the reference system XYZ. Rotation of the tiltable platform 50 can be controlled via actuation structures 53, for example of an electrostatic or piezoelectric type, illustrated schematically. The tiltable platform 50 carries a reflecting surface 55.

In use, the voltage sources 46, 47 are controlled in phase opposition.

In a first step, an actuation voltage (typically comprised between 20 V and 60 V) is applied to the first piezoelectric bands 44 through the first source 46, and the second piezoelectric bands 45 are set at a ground voltage (i.e., 0 V) through the second source 47. In these conditions, in the first step the first arms 40, 41 undergo deformation and bend, rotating about the second rotation axis B so as to bring their ends connected to the subsequent second arms 42, 43 and the second spring portions 38, 39 into a raised position with respect to the plane of rest. In this way, the half of the actuation structure 24 located on the same side as the anchorage elements 32, 33 with respect to the second rotation axis B rotates upwards (outside the cavity), and the second arms 42, 43 rotate rigidly, since they are not biased.

In a second step, the actuation voltage is applied to the second piezoelectric bands 45 through the second source 47, and the first piezoelectric bands 44 are set at ground voltage (i.e., 0 V) through the first source 46. Opposite to the above, in this case the second arms 42, 43 bend, rotating about the second rotation axis B in a direction opposite to the previous one so as to cause rotation upwards (outside the cavity) of the half of the actuation structure 24 that is located on the side of the second rotation axis B opposite to that of the anchorage elements 32, 33.

By alternately controlling the voltage sources 46, 47 according to a sequence of first and second steps, it is possible to obtain tilting of the tiltable structure 22 and thus of the reflecting surface 55 according to a vertical scan at a desired frequency (for example, 60 Hz).

Even though the device of FIGS. 3 and 4 is advantageous in that it enables use of unipolar voltages, in certain situations it is subject to out-of-plane movements (i.e., in a direction parallel to a third axis Z of the reference system XYZ) that do not enable its use in some applications.

In fact, the silicon layer forming the arms 40-43 has a small thickness, for example 20 μm, so as to maximize the displacement of the arms 40-43 as a result of the piezoelectric actuation of the piezoelectric bands 44, 45. However, the small thickness of the arms 40-43 causes them to be more sensitive to undesirable out-of-plane movements. In other words, the micromechanical device 20 has a lower stiffness with respect to the out-of-plane movements.

Consequently, the corresponding frequency of the out-of-plane mode of the micromechanical device 20 is reduced. In fact, the stiffness and the frequency of the corresponding mode are linked by the following mathematical relation:

$$k = m(2\pi f)^2 \qquad \text{Eq. 1}$$

where k is the stiffness of the corresponding mode of the arms 40-43, m is their mass referred to the corresponding mode, and f is the frequency of the corresponding mode. A lower stiffness in one direction (in particular, along the third axis Z) entails a lower frequency of the corresponding mode.

In this respect, it is noted that the frequency of the out-of-plane mode is close to the quasi-static actuation frequency (for example, comprised between 60 Hz and 120 Hz) of the micromechanical device 20, given the lower stiffness with respect to out-of-plane movements of the device itself. Consequently, the quasi-static movements of the micromechanical device 20 are affected in a non-negligible way by the out-of-plane movements, which comprise an element of disturbance to the further torsional movements with respect to the first rotation axis A and/or to the second rotation axis B and may thus give rise to incorrect readings.

In addition, the greater sensitivity to out-of-plane movements causes a greater sensitivity of the micromechanical device 20 to out-of-plane shocks, reducing the strength thereof.

There is a need in the art to provide a micromechanical device that overcomes the drawbacks of the prior art.

SUMMARY

According to this disclosure, a micromechanical device is provided. For example, disclosed herein is a micromechanical device including a fixed structure, a mobile portion rotatable about a first rotation axis, and a first actuation structure coupling the fixed structure to the mobile portion to enable rotation of the mobile portion about the first rotation axis. The mobile portion includes a supporting structure, a tiltable platform rotatable about a second rotation axis transverse to the first rotation axis, and a second actuation structure coupled between the tiltable platform and the supporting structure. Stiffening elements are coupled between the supporting structure and the fixed structure.

BRIEF DESCRIPTION OF THE DRAWINGS

For a better understanding, embodiments thereof are now described, purely by way of non-limiting example, with reference to the attached drawings, wherein:

FIG. 6 is a cross-sectional view, taken along section line VI-VI of FIG. 5, of the micromechanical device of FIG. 5;

FIG. 7 is a cross-sectional view, taken along section line VII-VII of FIG. 5, of the micromechanical device of FIG. 5;

DETAILED DESCRIPTION

Figure 5:
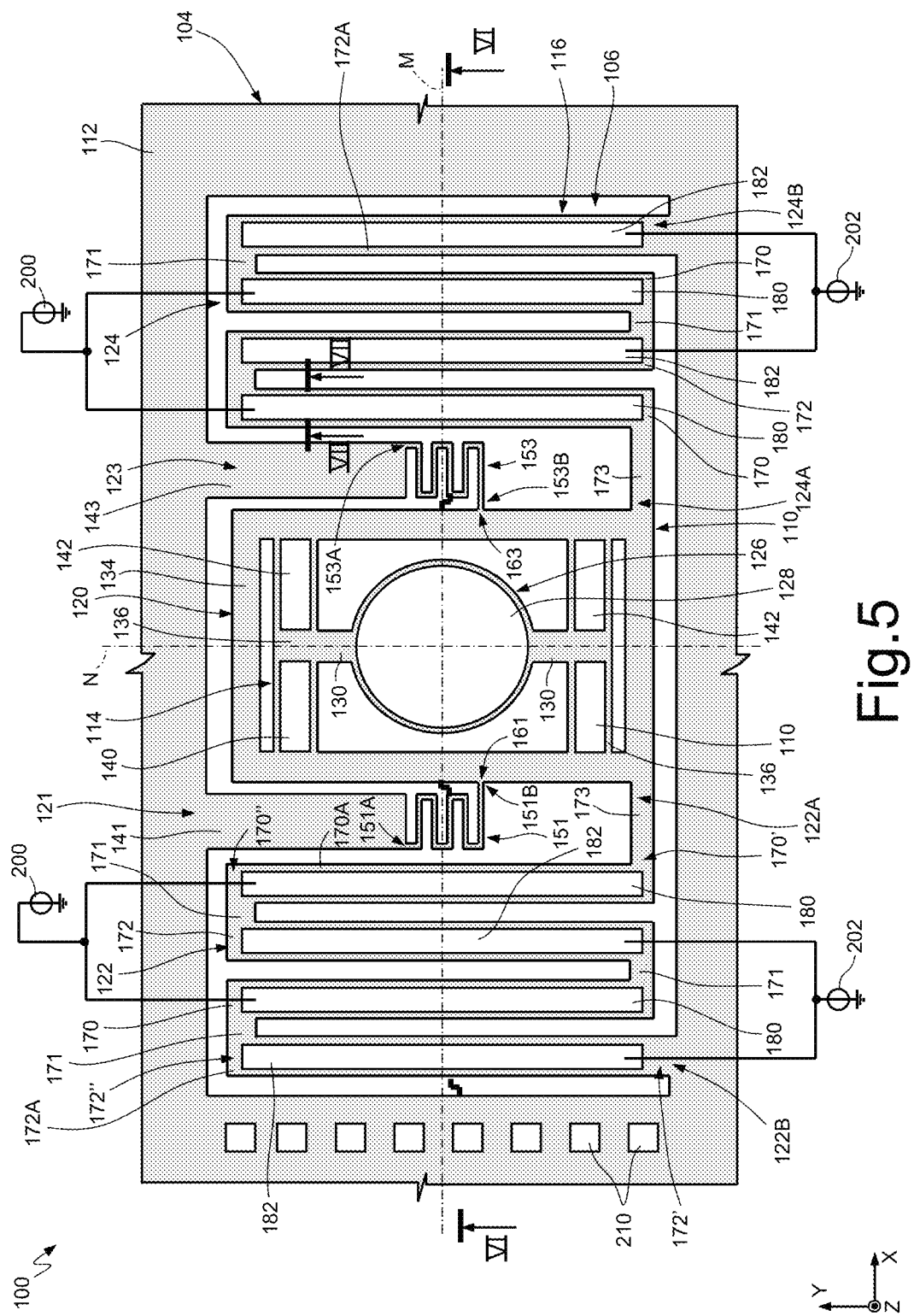
FIG. 5 is a schematic top plan view of a micromechanical device disclosed herein.

FIGS. 5-7 are schematic illustrations of a micromechanical device 100, in particular a micromirror of a MEMS (Micro-Electro-Mechanical Systems) type, in a rest condition.

The micromechanical device 100 comprises a supporting body 102, of semiconductor material (for example, silicon). In particular, the supporting body 102 has a quadrangular (for example, rectangular) shape in top plan view, and houses a cavity 106 (FIG. 6). The supporting body 102 comprises a plurality of supporting elements 102A-102C, shaped, in top plan view, like a quadrangular (for example, rectangular) frame, not visible in the drawings. Moreover, the supporting body 102 may be attached to a substrate (not illustrated).

The micromechanical device 100 further comprises a functional plate 104, prevalently two-dimensional and extending in an extension plane P parallel to a plane XY of a Cartesian reference system XYZ. In particular (FIG. 6), the functional plate 104 is fixed to the supporting body 102 (and, thus, to the plurality of supporting elements 102A-102C) through an interposition layer 108 (for example, an oxide or glue layer), extending over the supporting body 102.

In greater detail, the functional plate 104 comprises a tiltable structure 110 and a bearing structure 112, which surrounds the tiltable structure 110.

In particular, the bearing structure 112 has the shape, in a top plan view (FIG. 5), of a quadrangular (for example, rectangular) frame and it is coupled to the supporting body 102, in particular to the supporting element 102A. The tiltable structure 110 and the bearing structure 112 are obtained from a same die of semiconductor material, for example silicon, using semiconductor processing techniques such as etching, growth, deposition, and/or selective removal.

The tiltable structure 110 is able to rotate about a first rotation axis M (also defined, here, as slow, or quasi-static, rotation axis), parallel to axis X of the Cartesian reference system XYZ. Moreover, the tiltable structure 110 is suspended over the cavity 106 and comprises a mobile portion 120, coupled to the bearing structure 112 through stiffening elements 121, 123. In detail, the stiffening elements 121, 123 are coupled to the supporting body 102, in particular to the supporting element 102B.

The mobile portion 120 comprises a tiltable platform 126, which carries a reflecting surface 128. In particular, the reflecting surface 128 is here a mirror.

The tiltable platform 126 is able to rotate about a second rotation axis N (also defined, here, as fast rotation axis, or resonant axis, which resonates, for example, at 38 kHz), parallel to an axis Y of the Cartesian reference system XYZ, thanks to platform-supporting beams (hereinafter also defined as torsion arms) 130. In detail, the torsion arms 130 are fixed to the tiltable platform 126 at respective first ends and are arranged in the extension direction of the second rotation axis N, symmetrically with respect to the first rotation axis M.

The mobile portion 120 further comprises a supporting structure 134, in particular a frame element, having the shape, in top plan view (FIG. 5), of a quadrangular (for example, rectangular frame, surrounding the tiltable portion 126), coupled to the supporting body 102, in particular to the supporting element 102B. The tiltable portion 126 is fixed to the supporting structure 134 through the torsion arms 130.

The mobile portion 120 further comprises a first actuation structure 114, including actuation arms 136. In particular, the actuation arms 136 are connected at the center to respective second ends of the torsion arms 130 and extend in a direction transverse, in particular perpendicular, to the torsion arms 130; moreover, the actuation arms 136 are arranged in a symmetrical way with respect to the first rotation axis M.

The actuation arms 136 carry first and second actuation elements 140, 142 (illustrated only schematically in FIG. 5), for example of a piezoelectric type. In particular, the actuation elements 140, 142 are arranged symmetrically with respect to the second rotation axis N and here have a main extension in directions parallel to the first rotation axis M.

In use, the actuation elements 140, 142 are electrically controlled by respective voltage sources (not illustrated), biased in an alternating way (for example, through a pulsed signal, such as a square wave) with a voltage, for example, of 40 V, so as to control the orientation of the tiltable platform 126 (and, thus, of the reflecting surface 128) about the second rotation axis N (resonant movement).

As previously anticipated, the first and second stiffening elements 121, 123 make the mobile portion 120 rigid with the bearing structure 112. In particular, the stiffening elements 121, 123 comprise respective projecting arms 141, 143, transverse, in particular perpendicular, to axis X of the Cartesian reference system XYZ; and respective connection portions 151, 153. The connection portions 151, 153 are, for example, spring elements and are constrained, at a respective first end 151A, 153A, to the respective projecting arms 141, 143 and, at a respective second end 151B, 153B, to respective constraint points 161, 163 arranged on opposite sides (i.e., symmetrical with respect to the second rotation axis N) of the supporting structure 134. With the present configuration, the connection portions 151, 153 have respective rotation axes that coincide with the first rotation axis M of the tiltable structure 110 of the micromechanical device 100.

The connection portions 151, 153 have a stiffness, for example, of 250 N/m in regard to movements (deformations) along axis Z. In this way, in use, the connection portions 151, 153 limit the out-of-plane movements of the tiltable structure 110, without interfering with the movements about the first rotation axis M and/or the second rotation axis N. The tiltable structure 110 is consequently less deformable in regard to movements perpendicular to the extension plane P, i.e., to movements along axis Z of the Cartesian reference system XYZ.

The tiltable structure 110 further comprises a second actuation structure 116, including deformable elements 122, 124 arranged laterally with respect to the mobile portion 120, in particular on opposite sides thereof, intersected by the first rotation axis M. The deformable elements 122, 124 are thus arranged symmetrically with respect to the mobile portion 120, as well as to the second rotation axis N.

In greater detail, the deformable elements 122, 124 are connected to the supporting structure 134 via respective first ends 122A, 124A and to the bearing structure 112 via respective second ends 122B, 124B. In the embodiment of FIG. 5, the deformable elements 122, 124 are suspended over the cavity 106 and have, for example, a serpentine shape.

In particular, each deformable element 122, 124 comprises respective first and second deformable arms 170, 172, having a main extension parallel to the second rotation axis N, and respective first and second transverse arms 171, 173, having a main extension parallel to the first rotation axis M. In detail, the first and second deformable arms 170, 172 alternate with each other along the first rotation axis M and have respective first and second ends 170', 170'', 172', 172''.

The second transverse arms 173 connect the supporting structure 134 to the first end 170' of the first deformable arm 170 of each first and second deformable structure 122, 124 immediately adjacent (in FIG. 5, the arm is designated by the reference number 170A), so as to connect the deformable structures 122, 124 to the mobile portion 120, and the second transverse arms 171 alternately connect adjacent ends of the remaining first and second deformable arms 170, 172 so as to form the serpentine structure.

The second deformable arms 172 more distant from the mobile portion 120 (in FIG. 5, designated by the reference number 172A) are attached to the bearing structure 112 via the second end 122A, 124A (here, coinciding with the first end 172' of each second deformable arm 172A).

Each of the first deformable arms 170 carries a respective first band 180 of piezoelectric material. Likewise, each of the second deformable arms 172 carries a respective second band 182 of piezoelectric material. For instance, the bands 180, 182 may be a PZT-based ceramic.

As illustrated in FIG. 7, each band 180, 182 comprises a stack formed by a first electrode 191, a piezoelectric material layer 192, and a second electrode 193. An insulating layer 190 extends between the stack 191-193 and the deformable arms 170, 172. Each band 180, 182 can thus be electrically represented as a capacitor, the first electrode 191 of which is grounded and the second electrode 193 of which is biased as described below.

In detail, the first bands 180 are electrically connected to a first voltage source 200, and the second bands 182 are electrically connected to a second voltage source 202 via conductive paths (not illustrated).

Finally, the bearing structure 112 comprises a plurality of contacts 210, here arranged on the bearing structure 112 on just one side thereof, designed to bias the first and second actuation elements 140, 142, as well as the first and second bands 180, 182.

In use, in the absence of biasing of the bands 180, 182, the deformable elements 122, 124 and the mobile portion 120 are coplanar and lie in the extension plane P.

When the micromechanical device 100 is biased, thanks to the previously described serpentine structure, the first and second deformable arms 170, 172 undergo deformation so as to govern the rotation of the mobile portion 120 in opposite directions, as described in detail hereinafter.

Figure 8:
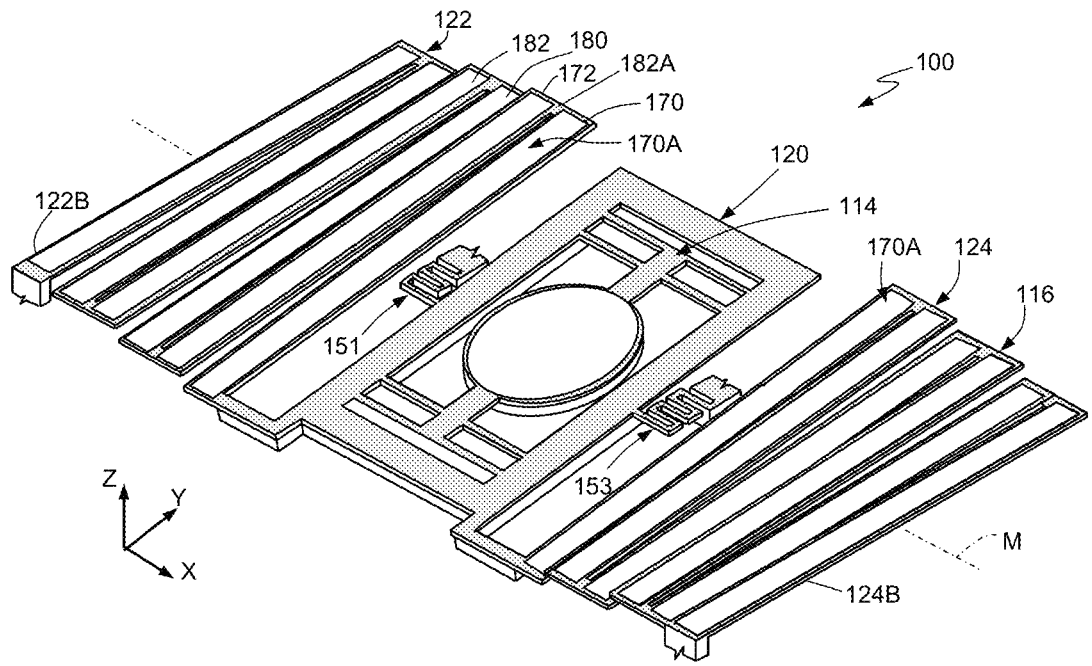
FIG. 8 is a simplified perspective view of the micromechanical device disclosed herein in a first actuation step.
Figure 9:
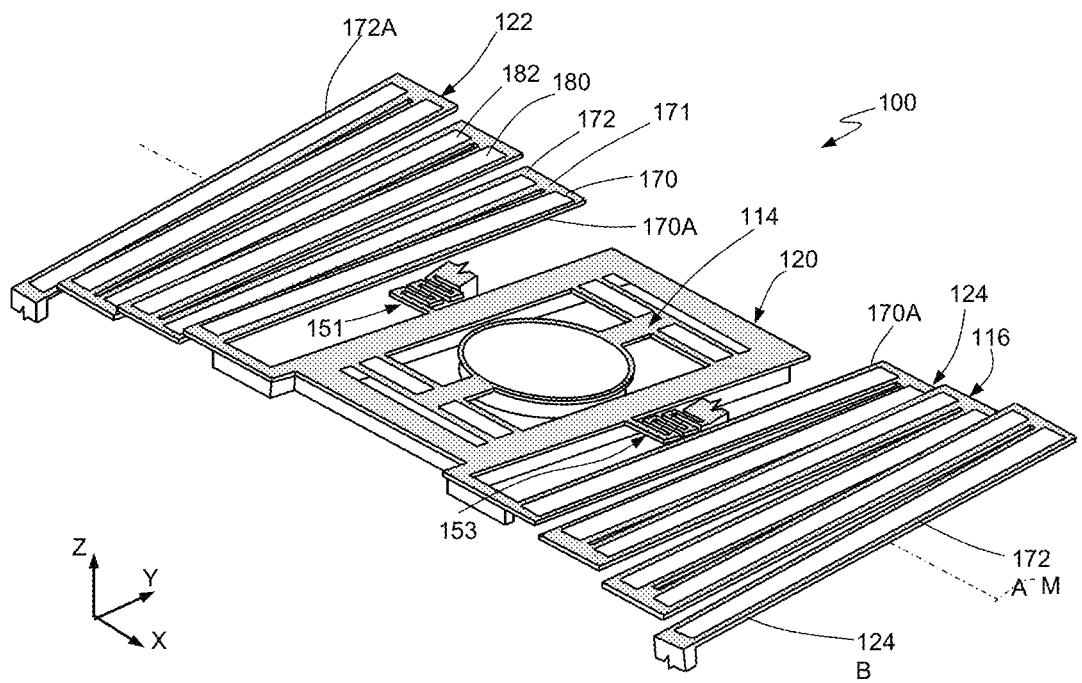
FIG. 9 is a simplified perspective view of the micromechanical device disclosed herein in a second actuation step.

FIGS. 8 and 9 show a first operating step and a second operating step of the micromechanical device 100.

In particular, in the first step, an actuation voltage (for example, of 40 V) is applied to the first bands 180 through the first source 200, and a ground voltage (i.e., of 0 V) is applied to the second bands 182 through the second source 202. In these conditions, the first deformable arms 170 undergo deformation, bend, and rotate about the first rotation axis M so as to bring their second ends 170'', 172'' into a raised position with respect to the extension plane P (FIG. 8), causing the corresponding half of the first and second deformable elements 122, 124, as well as of the mobile portion 120, to rotate. Since the second deformable arms 172 are not biased, they are not deformed but turn rigidly with the first deformable arms 170.

As illustrated in FIG. 8, the rotation angle of the first deformable arms 170 increases as the arms move away from the second ends 122B, 124B of the first and second deformable elements 122, 124 until a maximum of approximately 8° is reached for the first transverse arms 171 connected to the first deformable arms 170A.

In the second step (see FIG. 9), the actuation voltage (for example, of 40 V) is applied to the second bands 182 through the second source 202, and the ground voltage (i.e., of 0 V) is applied to the first bands 180 through the first source 200. Opposite to the above, in this case the second deformable arms 172 bend and rotate about the first rotation axis M in a direction opposite to the previous one.

Also in this case, the rotation angle of the second deformable arms 172 increases as these approach the second ends 122B, 124B until a maximum of approximately 8° is reached for the first transverse arms 171 connected to the first deformable arms 170A (in a direction opposite to the first step).

By alternately controlling the voltage sources 200, 202 according to a sequence of first and second steps, it is possible to obtain tilting of the mobile portion 120, as well as of the reflecting surface 128, according to a vertical scan, for example, at 60 Hz or 120 Hz.

In both of the previously described operating steps, the stiffening elements 121, 123 increase the total stiffness of the micromechanical device 100, in particular of the mobile portion 120, in regard to out-of-plane movements; moreover, the stiffening does not have an adverse effect on the quasi-static torsional movements of the tiltable structure 110 (in particular, in the case illustrated in FIGS. 5-9, about the first rotation axis M).

With reference to Eq. (1), the higher stiffness of the mobile portion 120 entails a higher frequency of the oscillation modes of the micromechanical device 100. In particular, the Inventors have found that insertion of the connection portions 151, 153 in the micromechanical device 100 generates a substantial frequency increase (in particular, in the resonance frequency) of the out-of-plane modes, without substantially modifying the frequency (in particular, the resonance frequency) of the quasi-static torsional modes given the same mass of the tiltable structure 110. Consequently, as expressed by Eq. (1), the micromechanical device 100 has a constant stiffness in regard to the torsional modes; in addition, the stiffness in regard to the out-of-plane modes increases as the corresponding frequency increases. Moreover, the presence of the supporting structure 134 enables decoupling of the resonant movement of the tiltable platform 126 from the quasi-static movement of the tiltable structure 110.

For instance, considering an actuation voltage of 30 V, the frequency of the out-of-plane mode is 1327 Hz and the frequency of the torsional mode is 468 Hz for the micromechanical device 100. On the other hand, in case of a micromechanical device lacking the connection portions 151, 153 and in the same operating conditions, the frequency of the out-of-plane mode would be 411 Hz, and the frequency of the torsional mode would be 459 Hz. Consequently, the addition of the connection portions 151, 153 increases by approximately three times the frequency of the out-of-plane mode and maintains the frequency of the torsional mode practically constant.

Figure 10:
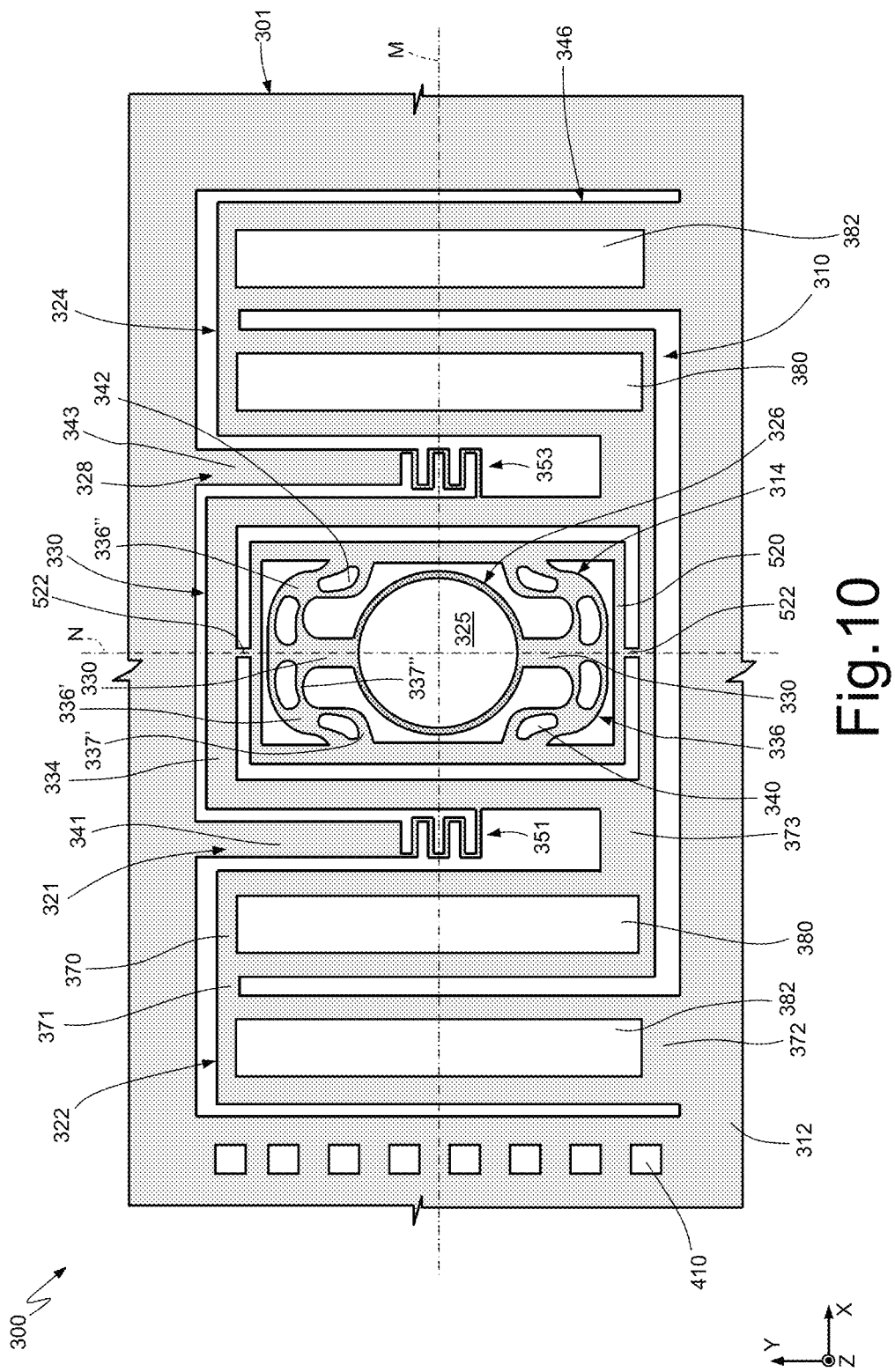
FIGS. 10-12 are simplified top plan views of further embodiments of the micromechanical device disclosed herein.

FIG. 10 shows another embodiment of the present micromechanical device, in rest conditions. In detail, FIG. 10 shows a micromechanical device 300 having a general structure similar to the micromechanical device 100 illustrated in FIGS. 5-9, so that parts similar those illustrated and described with reference to FIGS. 5-9 are designated in FIG. 10 by reference numbers increased by 200 and need not be described any further.

In the micromechanical device 300 the actuation arms 336 are each formed by first and second portions 336', 336", symmetrical with respect to the second rotation axis N. Here, each portion 336', 336" is S-shaped and comprises first and second sub portions 337', 337", in structural continuity with each other. The first and second sub portions 337', 337" are arranged substantially transverse, in particular approximately perpendicular, to each other. In greater detail, the first sub portion 337' is approximately parallel to the second rotation axis N, and the second sub portion 337" is approximately parallel to the first rotation axis M.

The first sub portion 337' of the first portion 336' carries the first actuation element 340, also approximately parallel to the second rotation axis N; and the second sub portion 337" of the first portion 336' carries the second actuation element 342, approximately parallel to the first rotation axis M.

Moreover, the first sub portion 337' of the second portion 336" carries the second actuation element 342, approximately parallel to the second rotation axis N, and the second sub portion 337" of the second portion 336" carries the first actuation element 340, approximately parallel to the first rotation axis M.

In addition, the connection arms 336 are attached to a supporting structure 520, shaped like a quadrangular (for example, rectangular) frame, housed inside the supporting structure 334 and connected thereto through supporting arms 522, arranged parallel to the second rotation axis N.

In the embodiment presented herein, the micromechanical device 300 comprises two first deformable arms 370, two second deformable arms 372, two first transverse arms 371, and two second transverse arms 373.

In use, the micromechanical device 300 operates in a way similar to what has been previously discussed for the micromechanical device 100, in particular with reference to FIGS. 8 and 9.

In the present embodiment, the torsion arms 330 are formed by the same semiconductor layer forming the tiltable platform 326. In particular, the tiltable platform 326 and the torsion arms 330 have a thickness (i.e., an extension along axis Z) greater than the remaining portions of the mobile portion 320, for example, between 140 µm and 160 µm. This characteristic enables the micromechanical device 300 to rotate about the second rotation axis M at a high resonance frequency, higher than the micromechanical device 100 of FIGS. 5-9, for example 60 kHz.

Figure 11:
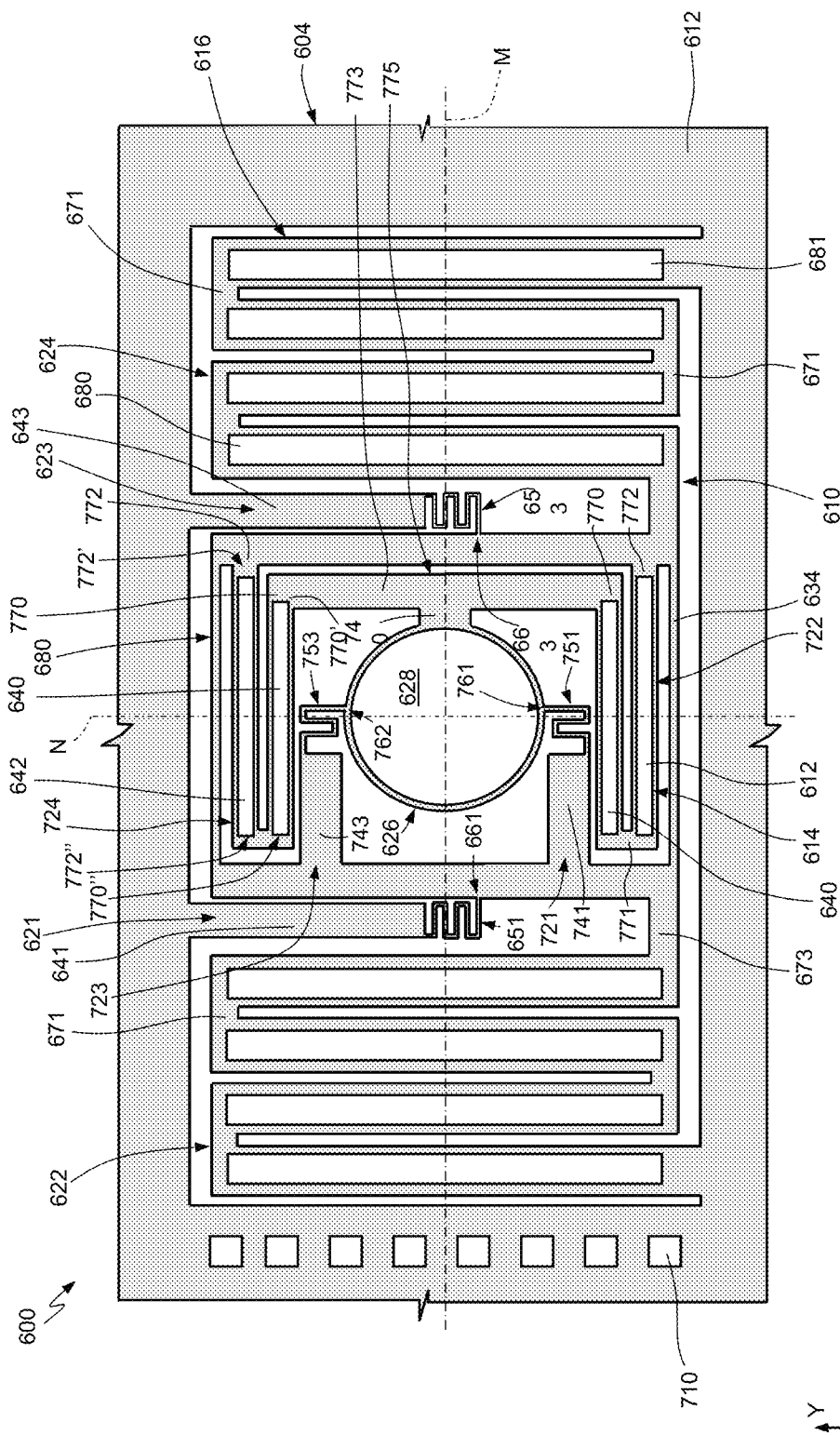

FIG. 11 shows a further embodiment of the present micromechanical device, in rest conditions. In detail, FIG. 11 shows a micromechanical device 600 having a general structure similar to the micromechanical device 100 illustrated in FIGS. 5-9 so that parts similar those illustrated and described with reference to FIGS. 5-9 are designated in FIG. 10 by reference numbers increased by 500 and need not be described any further.

In particular, here, the first and second axes of rotation M, N are both slow (quasi-static) rotation axes.

The mobile portion 620 comprises a third stiffening element 721 and a fourth stiffening element 723, arranged symmetrically with respect to the first rotation axis M, in particular laterally with respect to the tiltable platform 626. Moreover, the third and fourth stiffening elements 721, 723 are fixed to the tiltable platform 626 in respective constraint points 761, 763.

Each stiffening element 721, 723 comprises respective projecting arms 741, 743, parallel to the first rotation axis M, and respective connection portions 751, 753, in particular, the projecting arms 741, 743 extend from the supporting structure 634 towards the inside thereof, parallel to the first axis M. Moreover, the connection portions 751, 753 are, for example, spring elements and are arranged and fixed between the projecting arms 741, 743 and the constraint points 761, 763, respectively. With the present configuration, the connection portions 751, 753 have respective rotation axes that coincide with the second rotation axis N of the tiltable platform 626.

The connection portions 751, 753 have a stiffness, for example, of 250 N/m for movements (deformations) along axis Z, as previously discussed for the connection portions 151, 153 of the micromechanical device 100 of FIGS. 5-9.

Here, the first actuation structure 614 of the mobile portion 620 comprises further deformable elements 722, 724 (forming respective actuation arms 636), laterally arranged with respect to the tiltable platform 626, in particular on opposite sides thereof, and symmetrically with respect to the first rotation axis M. In the embodiment of FIG. 11, the further deformable elements 722, 724 have, for example, a serpentine shape.

Thus, each further deformable element 722, 724 comprises respective third and fourth deformable arms 770, 772, having a main extension parallel to the first rotation axis M, and respective third and fourth transverse arms 771, 773, having a main extension parallel to the second rotation axis N. In other words, the third and fourth deformable arms 770, 772 alternate with each other along the second rotation axis N.

In greater detail, each third and fourth deformable arm 770, 772 has respective first and second ends 770', 770", 772', 772". In particular, the fourth transverse arm 773 connects together the further deformable elements 722, 724, in particular at their respective first ends 770' of the third deformable arms 770 adjacent to the tiltable platform 626. The third transverse arms 771 connect the third and fourth deformable arms 770, 772 at their respective second ends 770", 772". Moreover, the first ends 772' of the fourth deformable arms 772 are attached to the supporting structure 634.

In addition, the tiltable platform 626 is connected to the fourth transverse arm 773 through a fixing arm 740, which extends from a central portion thereof, parallel to and along the first rotation axis M. The ensemble comprised of the fourth transverse arm 773 and the fixing arm 740 forms a T-shaped platform-supporting beam 775.

Each of the third deformable arms 770 carries the first actuation element 640 made of piezoelectric material; likewise, each of the fourth deformable arms 772 carries the second actuation element 642 made of piezoelectric material. For instance, the first and second actuation elements 640, 642 may be a PZT-based ceramic.

In use, the first and second actuation elements 640, 642 operate in a way similar to the first and second bands 680, 682 and in a way similar to what described with reference to FIGS. 8 and 9 for the first and second bands 180, 182 of the micromechanical device 100.

Figure 12:
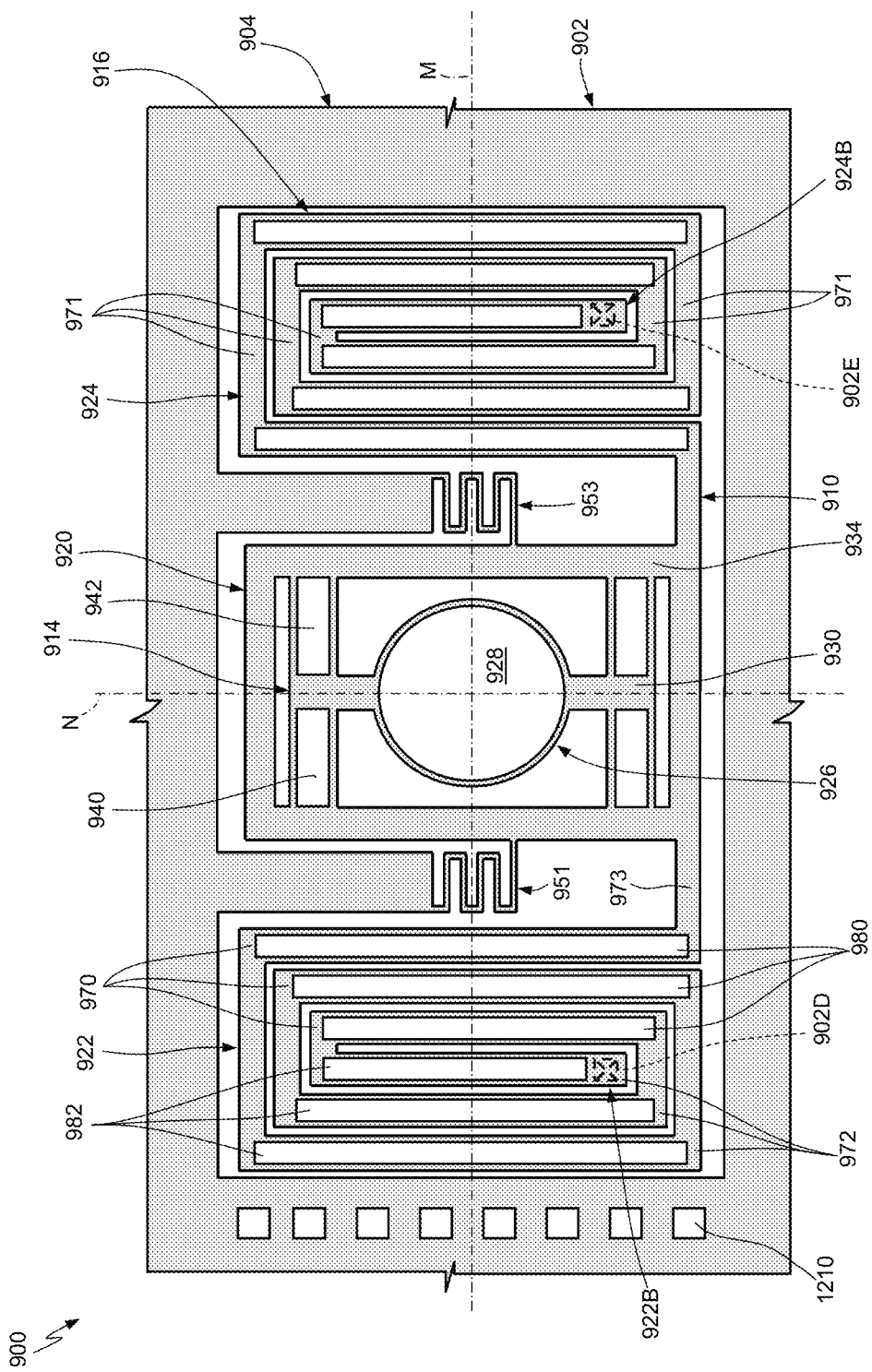

FIG. 12 shows a further embodiment of the present micromechanical device, in rest conditions. In detail, FIG. 12 shows a micromechanical device 900 having a general structure similar to the micromechanical device 100 illustrated in FIGS. 5-9, so that parts similar those illustrated and described with reference to FIGS. 5-9 are designated in FIG. 12 by reference numbers increased by 800 and need not be described any further.

Figure 1:
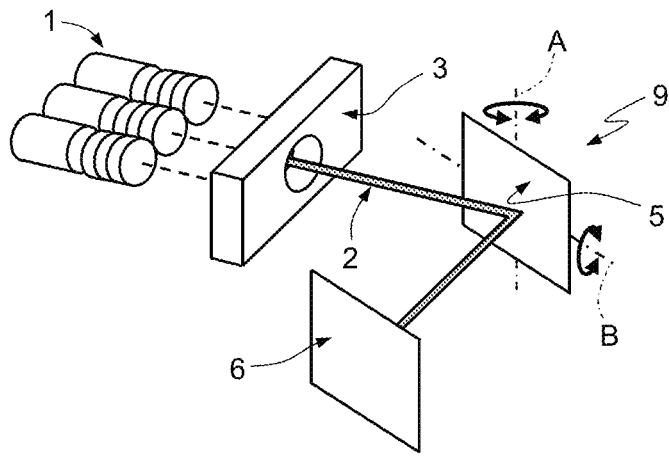
FIG. 1 is a schematic representation of a known pico-projector.
Figure 2:
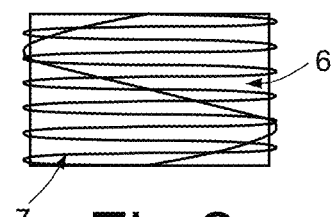
FIG. 2 shows the diagram of projection of an image generated by the pico-projector of FIG. 1 on a screen.
Figure 3:
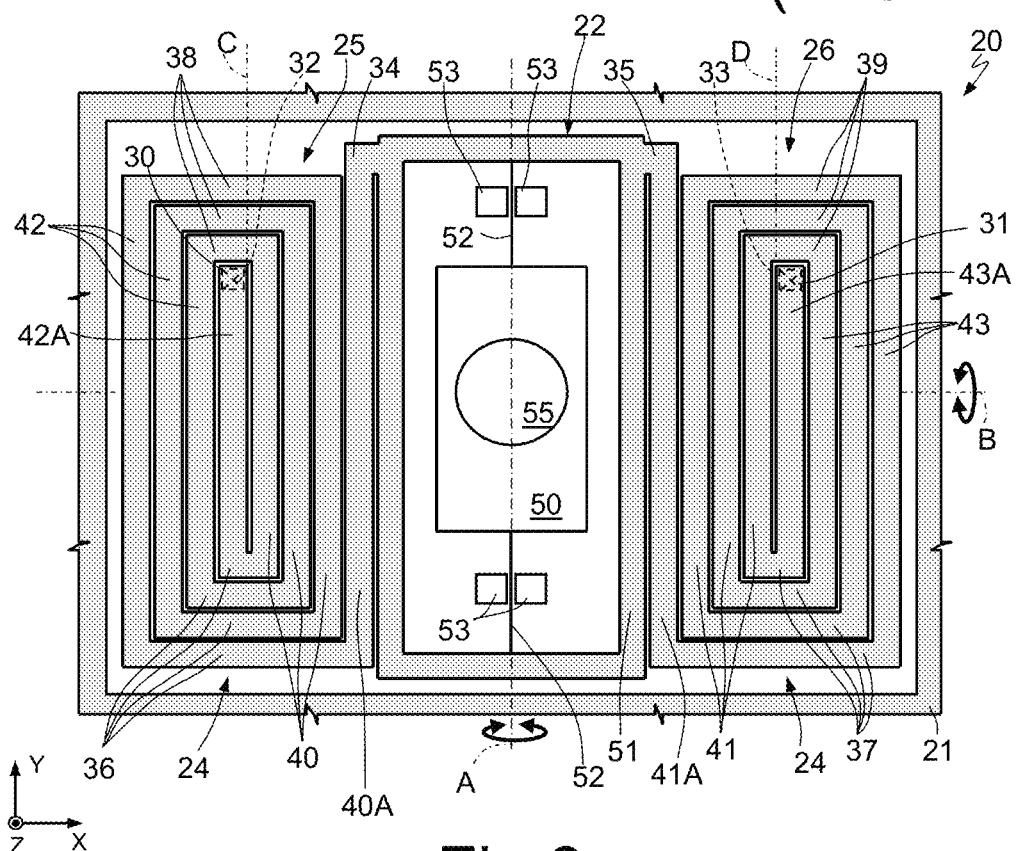
FIG. 3 is a schematic top plan view of a known micromechanical device.
Figure 4:
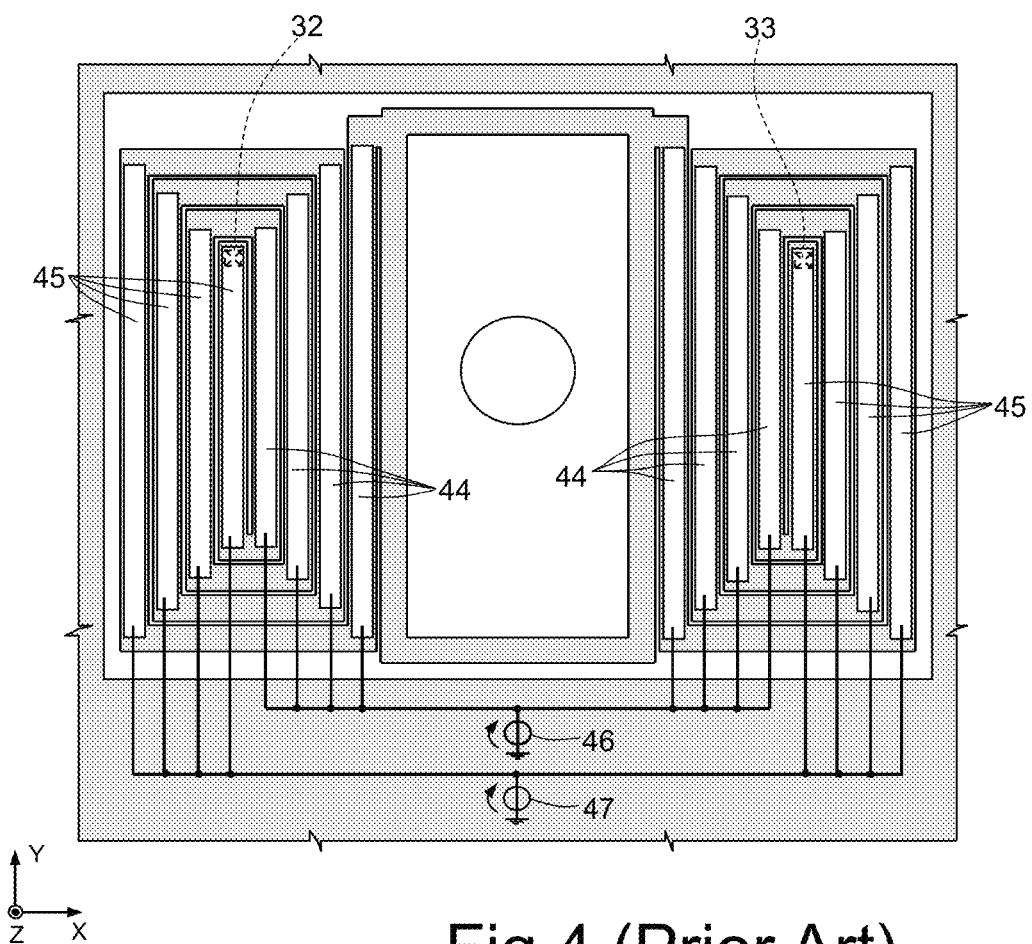
FIG. 4 is a simplified top plan view, with removed portions for clarity, of the micromechanical device of FIG. 3.

Here, the first and second deformable elements 922, 924 of the second actuation structure 916 are, for example, spiral-shaped, as disclosed in EP 3178783 cited above and described with reference to FIGS. 3-4. Moreover, the second ends 922B, 924B of the respective first and second deformable elements 922, 924 are coupled to the supporting body 902 at further supporting elements 902D, 902E (illustrated dashed and in top plan view in FIG. 12).

In use, the micromechanical device 900 operates in a way similar to the device 100 described with reference to FIGS. 8 and 9.

Thus, the microelectronic device 100, 300, 600, 900 can be used in a pico-projector 1101 designed to be functionally coupled to a portable electronic apparatus 1100, as illustrated hereinafter with reference to FIGS. 13-15.

Figure 13:
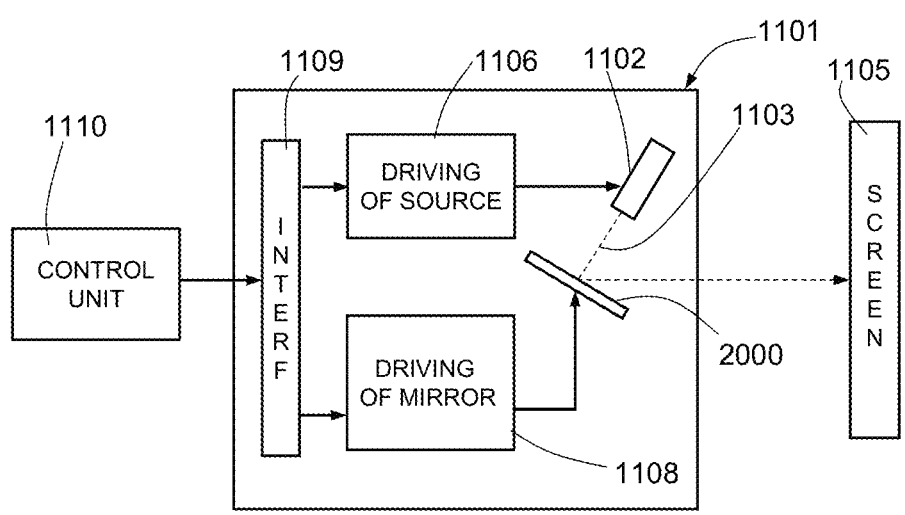
FIG. 13 is a block diagram of a pico-projector that uses the micromechanical device disclosed herein.

In detail, the pico-projector 1101 of FIG. 13 comprises a light source 1102, for example of a laser type, designed to generate a light beam 1103; the microelectronic device according to any of the previously illustrated embodiments, here designated as a whole by reference number 2000, designed to receive the light beam 1103 and direct it towards a screen or display surface 1105 (external to and at a distance from the pico-projector 1101 itself); a first driving circuit 1106, designed to supply appropriate control signals to the light source 1102, for generating the light beam 1103 as a function of an image to be projected; a second driving circuit 1108, designed to supply control signals to the sources 200, 202 (FIGS. 5, 7) of the microelectronic device 2000; and a communication interface 1109, designed to receive, from an external control unit 1110, for example included in the portable apparatus 1100, information regarding the image to be generated, for example in the form of a pixels array. This information is inputted for driving the light source 1102.

Figure 14:
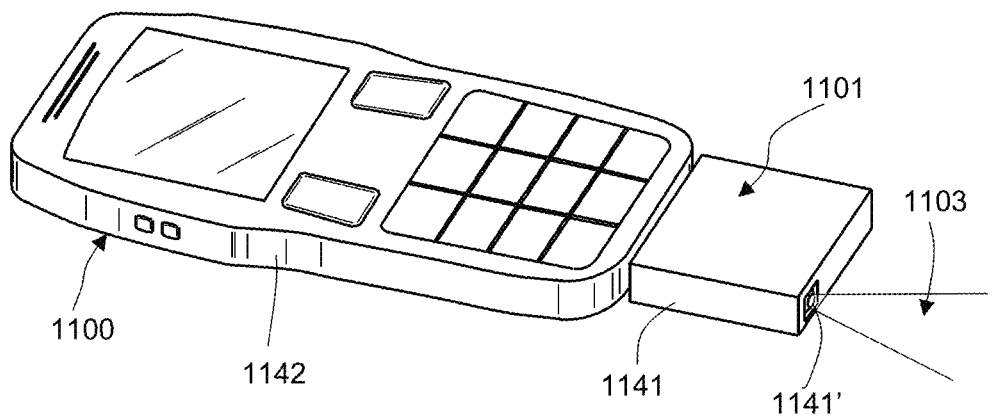
FIGS. 14 and 15 show coupling variants between the pico-projector of FIG. 13 and a portable electronic apparatus.

The pico-projector 1101 can be manufactured as a separate accessory that is stand-alone with respect to an associated portable electronic apparatus 1100, for example a mobile phone or smartphone, as illustrated in FIG. 14. In this case, the pico-projector 1101 is coupled to the portable electronic apparatus 1100 through appropriate electrical and mechanical connection elements (not illustrated in detail). Here, the pico-projector 1101 has an own casing 1141, with at least one portion 1141' transparent to the light beam 1103 coming from the microelectronic device 2000. The casing 1141 of the pico-projector 1101 is releasably coupled to a respective casing 1142 of the portable electronic apparatus 1100.

Figure 15:
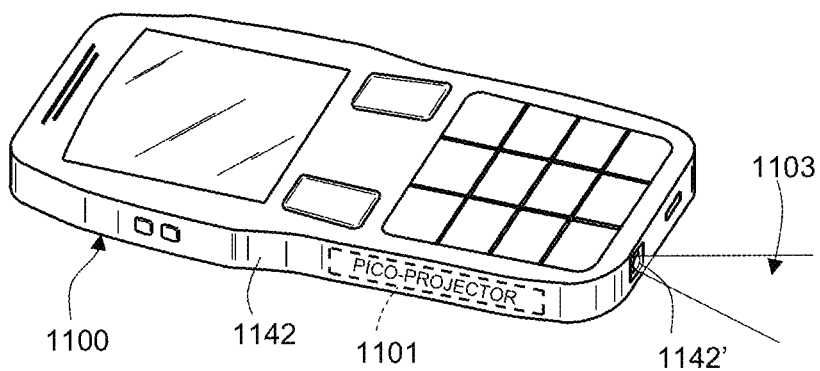

Alternatively, as illustrated in FIG. 15, the pico-projector 1101 may be integrated within the portable electronic apparatus 1100 and may be arranged within the casing 1142 of the portable electronic apparatus 1100. In this case, the portable electronic apparatus 1100 has a respective portion 1142' transparent to the light beam 1103 coming from the microelectronic device 2000. The pico-projector 1101 in this case is, for example, coupled to a printed circuit within the casing 1142 of the portable electronic apparatus 1100.

The present micromechanical device has various advantages.

The presence of the stiffening elements 121, 123, 321, 323, 521, 523, 921, 923, in particular of the connection portions 151, 153, 351, 353, 651, 653, 951, 953, enables limitation of the out-of-plane movement of the tiltable structure 110, 310, 610, 910, without affecting the torsional movement with respect to the first and second rotation axes M, N. In fact, the connection portions 151, 153, 351, 353, 651, 653, 951, 953 are designed so as to have a stiffness such that the frequency of the out-of-plane modes is much higher than the frequency of the quasi-static torsional mode of the micromechanical device 100, 300, 600, 900.

Moreover, the connection portions 151, 153, 351, 353, 651, 653, 951, 953 have a rotation axis that coincides with the quasi-static rotation axis/axes of the micromechanical device 100, 300, 600, 900 so as not to significantly affect the quasi-static torsional movement of the device itself.

Moreover, the introduction of the supporting structure 134, 334, 634, 934 in the mobile portion 120, 320, 620, 920 enables decoupling of the movement of the tiltable platform 126, 326, 626, 926 and of the tiltable structure 110, 310, 610, 910, reducing interference between the two movements.

The present micromechanical device 100, 300, 600, 900 has a compact structure, occupies a small area in a manufacturing wafer and integrates, for the embodiments described with reference to FIGS. 5-10 and 12, a scan both of a resonant type and of a quasi-static type, thus obtaining a two-dimensional raster-scanning micromirror.

Moreover, the use of actuators of a piezoelectric type in the first and second actuation structures 114, 116, 314, 316, 614, 616, 914, 916 enables a high actuation force at reduced actuation voltages, consequently reducing power consumption and enabling a simplified driving electronics.

Finally, it is clear that modifications and variations may be made to the micromechanical device described and illustrated herein, without thereby departing from the scope of this disclosure, as defined in the attached claims.

For instance, the embodiments presented herein may be combined with each other, without thereby departing from the scope of this disclosure.

In addition, the number of windings and the stiffness of the connection portions 151, 153, 351, 353, 651, 653, 951, 953 may be any, according to the specifications of the system in which the present micromechanical device 100, 300 600, 900 is inserted.

Moreover, instead of providing two separate voltage sources 200, 202, it is possible to use just one source, alternately connected to the first and second bands through a switch.

In addition, the connection portions 151, 153, 351, 353, 651, 653, 951, 953 may also be spring structures of a linear type, such as torsion arms.

The invention claimed is:

1. A micromechanical device, comprising:
a fixed structure;
a mobile portion rotatable about a first rotation axis;
a first actuation structure, coupling the fixed structure to the mobile portion to enable rotation of the mobile portion about the first rotation axis,
wherein the mobile portion comprises:
 a supporting structure;
 a tiltable platform rotatable about a second rotation axis transverse to the first rotation axis; and
 a second actuation structure coupled between the tiltable platform and the supporting structure; and
stiffening elements coupled between the supporting structure and the fixed structure.

2. The micromechanical device according to claim 1, wherein the stiffening elements each comprise a respective connection portion, each connection portion being arranged symmetrically with respect to the second rotation axis and configured to be rotatable about the first rotation axis.

3. The micromechanical device according to claim 2, wherein each connection portion comprises a spring element.

4. The micromechanical device according to claim 1, wherein each stiffening element comprises a projecting arm coupled between the fixed structure and a respective connection portion.

5. The micromechanical device according to claim 1, wherein the first actuation structure comprises first and second deformable arms extending transverse to the first rotation axis, each first and second deformable arm carrying respective first and second bands of piezoelectric material.

6. The micromechanical device according to claim 5, wherein the first and second deformable arms form a serpentine structure.

7. The micromechanical device according to claim 5, wherein the first and second deformable arms form a spiral structure.

8. The micromechanical device according to claim 5, wherein the first and second deformable arms extend in an alternating way and each second deformable arm extends between two adjacent first deformable arms; wherein the first bands of the first deformable arms are coupled to a first voltage source; and wherein the second bands of the second deformable arms are coupled to a second voltage source.

9. The micromechanical device according to claim 8, wherein the first and second voltage sources are configured to be controlled in phase opposition to one another.

10. The micromechanical device according to claim 8, wherein the supporting structure comprises a frame element, coupled between the tiltable platform and the stiffening elements; and wherein the second actuation structure comprises first and second actuation arms and at least one platform-supporting beam, the first and second actuation arms being coupled between the frame element and the at least one platform-supporting beam and carrying respective actuation elements, and the at least one platform-supporting beam being connected to the tiltable platform.

11. The micromechanical device according to claim 10, wherein the actuation elements are of a piezoelectric type.

12. The micromechanical device according to claim 10, wherein the first and second actuation arms extend parallel and symmetrically to each other with respect to the first rotation axis, the first and second actuation arms being symmetrical with respect to the second rotation axis, and the at least one platform-supporting beam forms a first torsion arm and the second actuation structure comprises a second torsion arm, the first and second torsion arms extending parallel to the second rotation axis between central areas of the first and second actuation arms and the tiltable platform.

13. The micromechanical device according to claim 12, wherein the frame element comprises first and second frames coupled to each other through supporting arms extending parallel to the second rotation axis, and wherein the first and second torsion arms and the first frame are in structural continuity with each other and have a same thickness, said same thickness being greater than a thickness of the supporting arms.

14. The micromechanical device according to claim 10, wherein each actuation arm comprises first and second portions symmetrical to each other with respect to the second rotation axis, each first and second portion being formed by respective first and second subportions, transverse and in structural continuity with each other, the first subportion extending approximately parallel to the second rotation axis and the second subportion extending approximately parallel to the first rotation axis, the first and second subportions carrying the actuation elements.

15. The micromechanical device according to claim 10, wherein the second actuation structure is serpentine-shaped and comprises third and fourth deformable arms extending parallel to the first rotation axis; and wherein the at least one platform-supporting beam is T-shaped with a transverse arm that extends between the first and second actuation arms and is parallel to the second rotation axis and a fixing arm that extends between the transverse arm and the tiltable platform parallel to the first rotation axis.

16. The micromechanical device according to claim 15, wherein the supporting structure further comprises further stiffening elements extending parallel to the first rotation axis and comprising:
respective further projecting arms fixed to the supporting structure; and
respective further connection portions coupled between the further projecting arms and the tiltable platform.

17. The micromechanical device according to claim 16, wherein the further connection portions are spring elements.

18. The micromechanical device according to claim 1, further comprising a supporting body of semiconductor material forming a cavity, the supporting body being coupled to the fixed structure, wherein the mobile portion and the first actuation structure are suspended over the cavity.

19. The micromechanical device according to claim 1, wherein the tiltable platform carries a reflecting surface.

20. A pico-projector for use in a portable electronic apparatus, comprising:
a light source actuatable to generate a light beam as a function of an image to be generated;
a micromechanical device comprising;
a fixed structure;
a mobile portion rotatable about a first rotation axis;
a first actuation structure, coupling the fixed structure to the mobile portion to enable rotation of the mobile portion about the first rotation axis,
wherein the mobile portion comprises:
a supporting structure;
a tiltable platform rotatable about a second rotation axis transverse to the first rotation axis; and
a second actuation structure coupled between the tiltable platform and the supporting structure; and
stiffening elements coupled between the supporting structure and the fixed structure; and
a driving circuit configured to supply signals driving rotation of the mobile portion.

21. The pico-projector according to claim 20, wherein the stiffening elements each comprise a respective connection portion, the connection portions being arranged symmetrically with respect to the second rotation axis and configured to be rotatable about the first rotation axis.

22. The pico-projector according to claim 21, wherein the connection portions are spring elements.

23. The pico-projector according to claim 20, wherein each stiffening element comprises a projecting arm coupled between the fixed structure and a respective connection portion.

24. The pico-projector according to claim 20, wherein the first actuation structure comprises first and second deformable arms extending transverse to the first rotation axis, each of the first and second deformable arms carrying respective first and second bands of piezoelectric material.

25. The pico-projector according to claim 24, wherein the first and second deformable arms form a serpentine structure.

26. The pico-projector according to claim 24, wherein the first and second deformable arms form a spiral structure.

27. The pico-projector according to claim 24, wherein the first and second deformable arms extend in an alternating way and each second deformable arm extends between two adjacent first deformable arms, wherein the first bands of the first deformable arms are coupled to a first voltage source, and wherein the second bands of the second deformable arms are coupled to a second voltage source.

* * * * *